(12) United States Patent
Edavana et al.

(10) Patent No.: US 12,490,959 B2
(45) Date of Patent: Dec. 9, 2025

(54) HEAT-DISSIPATING ARRANGEMENTS FOR MEDICAL DEVICES AND ASSOCIATED DEVICES, SYSTEMS, AND METHODS

(71) Applicant: KONINKLIJKE PHILIPS N.V., Eindhoven (NL)

(72) Inventors: Roopesh Edavana, Eindhoven (NL); Rob Wilhelmus Van Gils, Diessen (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 440 days.

(21) Appl. No.: 17/915,236

(22) PCT Filed: Mar. 23, 2021

(86) PCT No.: PCT/EP2021/057329
§ 371 (c)(1),
(2) Date: Sep. 28, 2022

(87) PCT Pub. No.: WO2021/197909
PCT Pub. Date: Oct. 7, 2021

(65) Prior Publication Data
US 2023/0130480 A1   Apr. 27, 2023

Related U.S. Application Data

(60) Provisional application No. 63/001,687, filed on Mar. 30, 2020.

(51) Int. Cl.
*A61B 8/00* (2006.01)
*A61B 8/08* (2006.01)
(Continued)

(52) U.S. Cl.
CPC ............ *A61B 8/546* (2013.01); *A61B 8/0891* (2013.01); *A61B 8/12* (2013.01); *A61B 8/445* (2013.01);
(Continued)

(58) Field of Classification Search
CPC ..................................................... A61B 8/546
See application file for complete search history.

(56) References Cited

U.S. PATENT DOCUMENTS 5,402,793 A * 4/1995 Gruner ................. A61B 1/0052
600/463
5,721,463 A * 2/1998 Snyder ................. A61B 8/4483
310/341

(Continued)

OTHER PUBLICATIONS

International Search Report and Written Opinion of PCT/EP2021/057329, dated Jun. 7, 2021.

*Primary Examiner* — Joseph M Santos Rodriguez

(57) ABSTRACT

Disclosed is a device for medical imaging, such as intravascular ultrasound (IVUS) imaging. The device includes a printed circuit board and an enclosure configured to disperse heat generated by the printed circuit board. The enclosure comprises a first heat spreader coupled to and in thermal contact with the printed circuit board, a second heat spreader in thermal contact with the first heat spreader at an interface such that the heat is distributed between the first heat spreader and the second heat spreader across the interface, a first cover portion coupled to and in thermal contact with the first heat spreader; and a second cover portion coupled to and in thermal contact with the second heat spreader, wherein the first cover portion is coupled to the second cover portion to form the enclosure.

17 Claims, 11 Drawing Sheets

(51) Int. Cl.
*A61B 8/12* (2006.01)
*H05K 5/06* (2006.01)
*H05K 7/20* (2006.01)

(52) U.S. Cl.
CPC .............. *A61B 8/56* (2013.01); *H05K 5/061* (2013.01); *H05K 7/20509* (2013.01)

(56) References Cited

U.S. PATENT DOCUMENTS

| | | |
|---|---|---|
| 6,663,578 B1 * | 12/2003 | Peszynski .............. A61B 8/467 601/2 |
| 7,846,101 B2 | 12/2010 | Eberle |
| 7,886,809 B2 | 2/2011 | Searls |
| 8,730,664 B1 | 5/2014 | Harris |
| 2012/0265077 A1 | 10/2012 | Gille |
| 2014/0058270 A1 | 2/2014 | Davidsen |
| 2016/0073553 A1 | 3/2016 | Chiang |
| 2016/0174939 A1 | 6/2016 | Cho |
| 2016/0360644 A1 | 12/2016 | Bains |
| 2019/0046156 A1 * | 2/2019 | De Cicco ................ A61B 6/12 |
| 2019/0162832 A1 | 5/2019 | Otsuka |

* cited by examiner

HEAT-DISSIPATING ARRANGEMENTS FOR MEDICAL DEVICES AND ASSOCIATED DEVICES, SYSTEMS, AND METHODS

TECHNICAL FIELD

The subject matter described herein relates to dissipating heat from electronic medical devices that may be positioned near a patient. The disclosed system provides devices, systems, and methods that dissipate heat from a patient interface module (PIM) in intravascular ultrasound (IVUS) imaging.

BACKGROUND

Ultrasound imaging involves the use of multiple electronic components that, during operation, may come into direct contact with a patient, clinician, or other user. Some devices are handheld and/or intended to be positioned on or near a patient bed. Increasing demands for speed and reliability, along with miniaturization of components and the use of increasingly powerful processors, means that modern handheld devices and other devices are becoming energy intensive, while simultaneously being packaged into smaller and smaller volumes. A larger enclosure generally sheds heat more effectively, as it has a larger surface area, whereas smaller devices may shed heat less effectively, thereby retaining more heat and thus, in general, may operate at higher temperatures. The demand or requirement to seal these devices to prevent fluid and particle ingress means that traditional passive or active ventilation systems may not be available for device cooling. At the same time, it may still be desirable to maintain the temperature of the device below a threshold to ensure safety, comfort, and/or device longevity, and where requirements exist as to the maximum surface temperatures such devices are permitted to achieve. This creates substantial challenges for thermal management of handheld or patient-proximate medical devices, and other devices.

One way this problem has been addressed is through use of an external fan. However, this approach may be unsuitable for medical devices used in a sterile environment, as the fans and ventilation ports collect dust and particles which can harbor bacteria and other infection-causing organisms. The heat transfer efficiency also depends on the orientation of the device, which can limit the utility of devices in a clinical environment. Another way heat management has been addressed in the past is through splitting the device. Many current generation and older generation device incorporate a split design approach to solve the thermal issues, providing one low-power device and one high-power device installed and kept far from sterile area, so that high speed fans can be used for thermal management. Unfortunately, splitting the functionality of the device in this way increases the cost of the device, decreases portability, and also takes away much-needed space in medical environments such as catheter labs, while also increasing overall service costs, as device operators may have to keep spares on hand for multiple modules.

Lack of effective thermal management for medical devices has resulted in devices having limited service life. Devices with poor thermal management suffer faster degradation and shorter mean time between failures (MTBF), and are thus replaced more often.

Ineffective heat dissipation from a device often means the device can fail before the usual or expected service life for similar devices, whereupon device manufacturers simply replace the failed device with a new or refurbished device (e.g., product warranty replacements). This adds substantial costs for the manufacturer, as well as down time for the user if a replacement device is not available immediately.

The information included in this Background section of the specification, including any references cited herein and any description or discussion thereof, is included for technical reference purposes only and is not to be regarded as subject matter by which the scope of the disclosure is to be bound.

SUMMARY

Disclosed is a system to manage and dissipate heat from a sealed, ingress-protected, thermoplastic portable medical device, or other portable electronic device, passively without the use of any external cooling. In some embodiments of the present disclosure, a system may be referred to as a PIM thermal management system. Operating principles of the PIM thermal management system may include passive heat dissipation, passive cooling, natural convection cooling, radiative cooling, and/or heat spreading, and may provide heat dissipation through a plastic enclosure of a hand held medical device, or other electronic device. The present disclosure provides devices, systems, and methods for dissipating heat from hand held and portable devices that are sealed for ingress protection. This may involve either or both of (1) dissipating heat through a thermoplastic enclosure surface, or (2) heat transfer through a conduit to a protected passive heat sink located external to the enclosure.

The PIM thermal management system disclosed herein has particular, but not exclusive, utility for compact medical imaging system components that may come in contact with a patient, clinician, or other user. One general aspect of the PIM thermal management system includes a device for medical imaging. The device includes a printed circuit board associated with obtaining medical images of a patient; and an enclosure, where the printed circuit board is disposed within the enclosure, where the enclosure is configured to disperse heat generated by the printed circuit board, where the enclosure includes: a first heat spreader coupled to and in thermal contact with the printed circuit board; a second heat spreader in thermal contact with the first heat spreader at an interface such that the heat is distributed between the first heat spreader and the second heat spreader across the interface; a first cover portion coupled to and in thermal contact with the first heat spreader; and a second cover portion coupled to and in thermal contact with the second heat spreader, where the first cover portion is coupled to the second cover portion to form the enclosure.

In some implementations, the enclosure includes a patient interface module (PIM) housing configured to be connected to an intraluminal imaging device, and the medical images include intraluminal medical images. In some implementations, the first heat spreader is thermally coupled to the printed circuit board by at least one of conductive protrusions, conductive fasteners, or conductive thermal gap pads. In some implementations, at least one of the first heat spreader or the second heat spreader includes a thermally conductive material. In some implementations, the first heat spreader includes a heat pipe or a vapor chamber. In some implementations, the second heat spreader includes a heat sink. In some implementations, the heat sink is enclosed within the ventilated enclosure. In some implementations, at least one of the first cover portion or the second cover portion includes a material with a higher emissivity and a lower thermal conductivity than the first and second heat spreaders. In some implementations, at least one heat spreader is coupled to at least one cover portion by a thermally conductive adhesive, and where a shape of the at least one heat spreader matches a shape of the at least one cover portion to maximize a thermal contact area. In some implementations, the first cover portion is coupled to the second cover portion by a plurality of fasteners. In some implementations, the enclosure is sealed to resist intrusion of moisture and dust. In some implementations, the printed circuit board includes at least one connector and a plurality of electronic components. In some embodiments, the first heat spreader is coupled to the printed circuit board by thermal gap pads on at least some of the electronic components, where the thermal gap pads are in contact with conductive protrusions formed into a surface of the first heat spreader. In some embodiments, the enclosure includes openings for the at least one connector. In some embodiments, the first heat spreader, the second heat spreader, the first cover portion, and the second cover portion are configured such that during operation of the printed circuit board, a surface temperature of the enclosure is below a threshold value. In some implementations, the first heat spreader is coupled to the second heat spreader by a lip and a groove.

One general aspect includes an intravascular ultrasound (IVUS) imaging system. The intravascular ultrasound includes an IVUS imaging catheter configured to be positioned within a blood vessel of a patient and obtain IVUS images of the blood vessel and a patient interface module (PIM) configured for communication with the IVUS imaging catheter, where the PIM includes: a printed circuit board including one or more electronic components associated with obtaining the IVUS images, where the one or more electronic components generate heat during operation; and a sealed enclosure resistant to intrusion of moisture and dust, where the printed circuit board is disposed within the enclosure, where the enclosure is configured to disperse the heat generated by the one or more electronic components, where the enclosure includes: a first heat spreader in thermal contact with the one or more electronic components; a second heat spreader in thermal contact with the first heat spreader at an interface such that the heat is distributed between the first heat spreader and the second heat spreader across the interface; a first cover portion coupled to and in thermal contact with the first heat spreader; and a second cover portion coupled to and in thermal contact with the second heat spreader, where the first cover portion is coupled to the second cover portion to form the sealed enclosure.

One general aspect of the PIM thermal management system includes a method of dispersing heat generated by a printed circuit board, comprising: providing a first thermally conductive heat spreader coupled to a first high-emissivity cover portion; providing a second thermally conductive heat spreader coupled to the first heat spreader and a second cover portion; positioning the printed circuit board between the first heat spreader and the second heat spreader; coupling the printed circuit board to at least one of the first heat spreader and the second heat spreader such that a thermal contact is formed; and coupling the first cover portion to the second cover portion to form a sealed enclosure, such that when the printed circuit board is operating, a surface temperature of the sealed enclosure is below a threshold value.

In some aspects, the printed circuit board is a printed circuit board of a patient interface module (PIM) for medical imaging. In some aspects, the first heat spreader is coupled to the printed circuit board by at least one of conductive towers, conductive fasteners, or conductive thermal gap pads, and at least one of the first heat spreader and second heat spreader comprises a thermally conductive material, a heat pipe or a vapor chamber. In some aspects, the second heat spreader comprises a heat sink, and the heat sink is enclosed in an unsealed enclosure coupled to the sealed enclosure.

This Summary is provided to introduce a selection of concepts in a simplified form that are further described below in the Detailed Description. This Summary is not intended to identify key features or essential features of the claimed subject matter, nor is it intended to limit the scope of the claimed subject matter. A more extensive presentation of features, details, utilities, and advantages of the PIM thermal management system, as defined in the claims, is provided in the following written description of various embodiments of the disclosure and illustrated in the accompanying drawings.

BRIEF DESCRIPTION OF THE DRAWINGS

Illustrative embodiments of the present disclosure will be described with reference to the accompanying drawings, of which.

DETAILED DESCRIPTION

Figure 1:
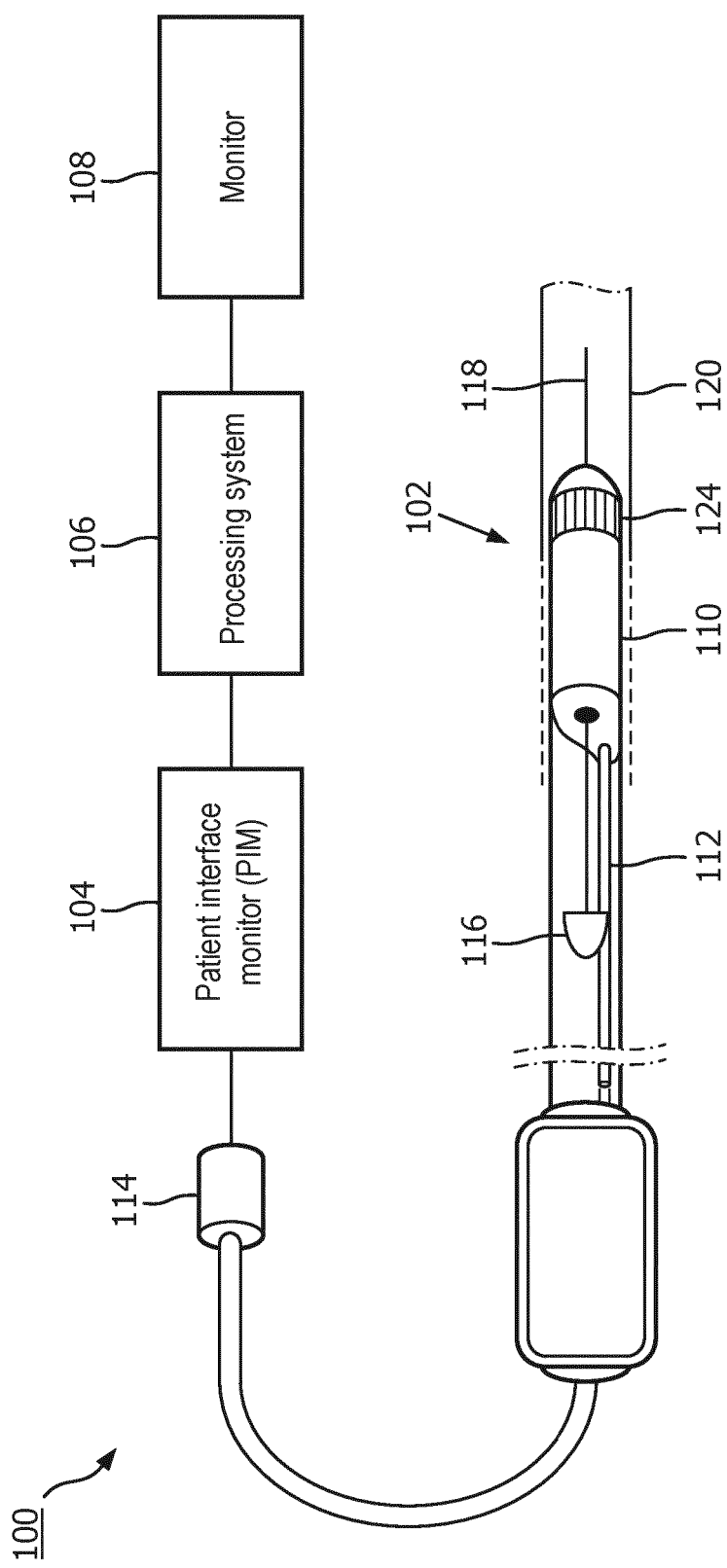
FIG. 1 is a diagrammatic schematic view of an intraluminal imaging system, according to aspects of the present disclosure.

The present disclosure provides devices, systems, and methods for dissipating heat generated by compact (e.g., handheld) and portable medical devices or other electronic devices that are sealed for ingress protection, including either or both of (1) dissipating heat through a thermoplastic enclosure surface, or (2) heat transfer through a thermal conduit to deliver heat energy to a passive heat sink located outside the enclosure. In some embodiments, the enclosure may be a sealed enclosure. Generally speaking, within an enclosed device, heat may be redistributed through conduction, radiation, and convection. Traditional devices rely primarily on radiation and convection to remove heat from a particular area, such as a heat-generating electronic component on a printed circuit board. However, conduction may be more effective than convection alone. High thermal resistance materials (i.e., materials with a low thermal conductivity), such as plastic housings or enclosures, may have a larger temperature gradient or change (ΔT) across them, which can increase the occurrence of hot spots, whereas low thermal resistance materials (i.e., materials with a high thermal conductivity) have lower ΔT, which can decrease the occurrence of hot spots. Accordingly, in some embodiments, low thermal resistance materials of a heat spreading element can be used to distribute heat to more locations on a plastic enclosure comprising a high resistance material. Further, in some embodiments, conduct heat directly from points on a PCB where heat is generated, and to spread it over a large area such that external convection and radiation can cool the device. In this manner, thermal resistance internal to the device can be reduced.

Dissipating heat through a thermoplastic enclosure surface may involve drawing heat from on-board components onto a heat spreader, which is thermally coupled to the plastic enclosure. The plastic enclosure then dissipates the heat to the external environment (e.g., air) through convection and radiation. The heat spreader may comprise a shape or outer profile that substantially matches an inner profile of the plastic enclosure to increase or maximize surface area contact between the heat spreader and the plastic enclosure to increase the dispersal of heat. This may have the effect of reducing surface temperature of the enclosure, increasing dissipation of heat from electronic components of a PCB, and minimizing the occurrence of hot spots. By utilizing a larger portion of the surface of the enclosure for heat transfer, the embodiments of the present disclosure provide for operation of a device such that the surface temperature of the enclosure of the device remains within the limits set by regulatory standards. At the same time, the embodiments of the present disclosure allow for the device to be both powerful and small. A sealed enclosure with no external fan or moving parts may prevent contamination from dust accumulation, and may allow for the device to be cleaned regularly using spray or immersion in disinfecting agents. The sealed enclosure can be resistant to intrusion of moisture and/or dust.

Since heat is spread across to all surfaces the heat transfer is not necessarily adversely affected by orientation of device. This approach provides high reliability and long service life, and permits the device to run at surface temperatures well below regulatory limits. Embodiments of the present disclosure may also provide device designs that combine substantial functionality into a single, simple, lightweight device that does not use changeable cartridges or other user intervention to remain within desired operating temperatures.

Heat transfer through a protected passive heat sink involves drawing heat from PCB components via a conductive surface or body, a heat pipe, a vapor chamber, or other heat spreader at least partially positioned within the sealed enclosure or on a surface of the enclosure, and transfers heat energy to the heat sink attached outside the sealed enclosure to dissipate heat to the external environment. User contact with the heat pipe, vapor chamber, heat spreader, or heat sink may be prevented by a protective grill or unsealed enclosure. This permits the heat sink to run at a surface temperature that is substantially higher than the limits set by regulatory standards for user access points. The heat sink may be designed to be detached from the main enclosure during cleaning and disinfection. In some embodiments, the heat dissipates through two thermal paths-one higher resistance path to the enclosure surface, and one low-resistance path to the protected heat sink. This helps to provide high reliability and keep the device size small, while permitting greater dissipation of heat without the need for moving parts. However, it will be understood that, in some embodiments, moving parts such as a fan or water cooling system may also be used to increase effectivity of the thermal management system.

In accordance with at least one embodiment of the present disclosure, a PIM thermal management system is provided which dissipates heat from a device while limiting the occurrence of hot spots. The present disclosure aids substantially in maintaining patient safety while permitting smaller and faster devices, by improving the heat distribution and dissipation across the entire surface of the device, and/or through an externally located, protected heat sink. The PIM thermal management system disclosed herein provides a practical increase in the amount of heat energy that can be safely dissipated in proximity to a patient, clinician, or other user. This improved thermal management may enable the transformation or replacement of larger, medical electronic devices with smaller, more powerful devices that nonetheless operate at lower surface temperatures. This unconventional approach improves the functioning of medical imaging systems and other electronic systems, by permitting greater user contact with high-powered devices.

These descriptions are provided for exemplary purposes only and should not be considered to limit the scope of the PIM thermal management system. Certain features may be added, removed, or modified without departing from the spirit of the claimed subject matter.

For the purposes of promoting an understanding of the principles of the present disclosure, reference will now be made to the embodiments illustrated in the drawings, and specific language will be used to describe the same. It is nevertheless understood that no limitation to the scope of the disclosure is intended. Any alterations and further modifications to the described devices, systems, and methods, and any further application of the principles of the present disclosure are fully contemplated and included within the present disclosure as would normally occur to one skilled in the art to which the disclosure relates. In particular, it is fully contemplated that the features, components, and/or steps described with respect to one embodiment may be combined with the features, components, and/or steps described with respect to other embodiments of the present disclosure. For the sake of brevity, however, the numerous iterations of these combinations will not be described separately.

FIG. 1 is a diagrammatic schematic view of an intraluminal imaging system incorporating the intraluminal directional guidance system, according to aspects of the present disclosure. The intraluminal imaging system 100 can be an intravascular ultrasound (IVUS) imaging system in some embodiments. The intraluminal imaging system 100 may include an intraluminal device 102, a patient interface module (PIM) 104, a console or processing system 106, and a monitor 108. The intraluminal device 102 is sized and shaped, and/or otherwise structurally arranged to be positioned within a body lumen of a patient. For example, the intraluminal device 102 can be a catheter, guide wire, guide catheter, pressure wire, and/or flow wire in various embodiments. In some circumstances, the system 100 may include additional elements and/or may be implemented without one or more of the elements illustrated in FIG. 1.

The intraluminal imaging system 100 (or intravascular imaging system) can be any type of imaging system suitable for use in the lumens or vasculature of a patient. In some embodiments, the intraluminal imaging system 100 is an intraluminal ultrasound (IVUS) imaging system. In other embodiments, the intraluminal imaging system 100 may include systems configured for forward looking intraluminal ultrasound (FL-IVUS) imaging, intraluminal photoacoustic (IVPA) imaging, intracardiac echocardiography (ICE), transesophageal echocardiography (TEE), and/or other suitable imaging modalities.

It is understood that the system 100 and/or device 102 can be configured to obtain any suitable intraluminal imaging data. In some embodiments, the device 102 may include an imaging component of any suitable imaging modality, such as optical imaging, optical coherence tomography (OCT), etc. In some embodiments, the device 102 may include any suitable non-imaging component, including a pressure sensor, a flow sensor, a temperature sensor, an optical fiber, a reflector, a mirror, a prism, an ablation element, a radio frequency (RF) electrode, a conductor, or combinations thereof. Generally, the device 102 can include an imaging element to obtain intraluminal imaging data associated with the lumen 120. The device 102 may be sized and shaped (and/or configured) for insertion into a vessel or lumen 120 of the patient.

The system 100 may be deployed in a catheterization laboratory having a control room. The processing system 106 may be located in the control room. Optionally, the processing system 106 may be located elsewhere, such as in the catheterization laboratory itself. The catheterization laboratory may include a sterile field while its associated control room may or may not be sterile depending on the procedure to be performed and/or on the health care facility. The catheterization laboratory and control room may be used to perform any number of medical imaging procedures such as angiography, fluoroscopy, CT, IVUS, virtual histology (VH), forward looking IVUS (FL-IVUS), intraluminal photoacoustic (IVPA) imaging, a fractional flow reserve (FFR) determination, a coronary flow reserve (CFR) determination, optical coherence tomography (OCT), computed tomography, intracardiac echocardiography (ICE), forward-looking ICE (FLICE), intraluminal palpography, transesophageal ultrasound, fluoroscopy, and other medical imaging modalities, or combinations thereof. In some embodiments, device 102 may be controlled from a remote location such as the control room, such than an operator is not required to be in close proximity to the patient.

The intraluminal device 102, PIM 104, and monitor 108 may be communicatively coupled directly or indirectly to the processing system 106. These elements may be communicatively coupled to the medical processing system 106 via a wired connection such as a standard copper link or a fiber optic link and/or via wireless connections using IEEE 802.11 Wi-Fi standards, Ultra Wide-Band (UWB) standards, wireless FireWire, wireless USB, or another high-speed wireless networking standard. The processing system 106 may be communicatively coupled to one or more data networks, e.g., a TCP/IP-based local area network (LAN). In other embodiments, different protocols may be utilized such as Synchronous Optical Networking (SONET). In some cases, the processing system 106 may be communicatively coupled to a wide area network (WAN). The processing system 106 may utilize network connectivity to access various resources. For example, the processing system 106 may communicate with a Digital Imaging and Communications in Medicine (DICOM) system, a Picture Archiving and Communication System (PACS), and/or a Hospital Information System via a network connection.

At a high level, an ultrasound imaging intraluminal device 102 emits ultrasonic energy from a transducer array 124 included in scanner assembly 110 mounted near a distal end of the intraluminal device 102. The ultrasonic energy is reflected by tissue structures in the medium (such as a lumen 120) surrounding the scanner assembly 110, and the ultrasound echo signals are received by the transducer array 124. The scanner assembly 110 generates electrical signal(s) representative of the ultrasound echoes. The scanner assembly 110 can include one or more single ultrasound transducers and/or a transducer array 124 in any suitable configuration, such as a planar array, a curved array, a circumferential array, an annular array, etc. For example, the scanner assembly 110 can be a one-dimensional array or a two-dimensional array in some instances. In some instances, the scanner assembly 110 can be a rotational ultrasound device. The active area of the scanner assembly 110 can include one or more transducer materials and/or one or more segments of ultrasound elements (e.g., one or more rows, one or more columns, and/or one or more orientations) that can be uniformly or independently controlled and activated. The active area of the scanner assembly 110 can be patterned or structured in various basic or complex geometries. The scanner assembly 110 can be disposed in a side-looking orientation (e.g., ultrasonic energy emitted perpendicular and/or orthogonal to the longitudinal axis of the intraluminal device 102) and/or a forward-looking looking orientation (e.g., ultrasonic energy emitted parallel to and/or along the longitudinal axis). In some instances, the scanner assembly 110 is structurally arranged to emit and/or receive ultrasonic energy at an oblique angle relative to the longitudinal axis, in a proximal or distal direction. In some embodiments, ultrasonic energy emission can be electronically steered by selective triggering of one or more transducer elements of the scanner assembly 110.

The ultrasound transducer(s) of the scanner assembly 110 can be a piezoelectric micromachined ultrasound transducer (PMUT), capacitive micromachined ultrasonic transducer (CMUT), single crystal, lead zirconate titanate (PZT), PZT composite, other suitable transducer type, and/or combinations thereof. In an embodiment the ultrasound transducer array 124 can include any suitable number of individual transducer elements or acoustic elements between 1 acoustic element and 1000 acoustic elements, including values such as 2 acoustic elements, 4 acoustic elements, 36 acoustic elements, 64 acoustic elements, 128 acoustic elements, 500 acoustic elements, 812 acoustic elements, and/or other values both larger and smaller.

The PIM 104 transfers the received echo signals to the processing system 106 where the ultrasound image (including the flow information) is reconstructed and displayed on the monitor 108. The console or processing system 106 can include a processor and a memory. The processing system 106 may be operable to facilitate the features of the intraluminal imaging system 100 described herein. For example, the processor can execute computer readable instructions stored on the non-transitory tangible computer readable medium.

The PIM 104 facilitates communication of signals between the processing system 106 and the scanner assembly 110 included in the intraluminal device 102. This communication may include providing commands to integrated circuit controller chip(s) within the intraluminal device 102, selecting particular element(s) on the transducer array 124 to be used for transmit and receive, providing the transmit trigger signals to the integrated circuit controller chip(s) to activate the transmitter circuitry to generate an electrical pulse to excite the selected transducer array element(s), and/or accepting amplified echo signals received from the selected transducer array element(s) via amplifiers included on the integrated circuit controller chip(s). In some embodiments, the PIM 104 performs preliminary processing of the echo data prior to relaying the data to the processing system 106. In examples of such embodiments, the PIM 104 performs amplification, filtering, and/or aggregating of the data. In an embodiment, the PIM 104 also supplies high- and low-voltage DC power to support operation of the intraluminal device 102 including circuitry within the scanner assembly 110.

The processing system 106 receives echo data from the scanner assembly 110 by way of the PIM 104 and processes the data to reconstruct an image of the tissue structures in the medium surrounding the scanner assembly 110. Generally, the device 102 can be utilized within any suitable anatomy and/or body lumen of the patient. The processing system 106 outputs image data such that an image of the vessel or lumen 120, such as a cross-sectional IVUS image of the lumen 120, is displayed on the monitor 108. Lumen 120 may represent fluid filled or fluid-surrounded structures, both natural and man-made. Lumen 120 may be within a body of a patient. Lumen 120 may be a blood vessel, such as an artery or a vein of a patient's vascular system, including cardiac vasculature, peripheral vasculature, neural vasculature, renal vasculature, and/or or any other suitable lumen inside the body. For example, the device 102 may be used to examine any number of anatomical locations and tissue types, including without limitation, organs including the liver, heart, kidneys, gall bladder, pancreas, lungs; ducts; intestines; nervous system structures including the brain, dural sac, spinal cord and peripheral nerves; the urinary tract; as well as valves within the blood, chambers or other parts of the heart, and/or other systems of the body. In addition to natural structures, the device 102 may be used to examine man-made structures such as, but without limitation, heart valves, stents, shunts, filters and other devices.

The controller or processing system 106 may include a processing circuit having one or more processors in communication with memory and/or other suitable tangible computer readable storage media. The controller or processing system 106 may be configured to carry out one or more aspects of the present disclosure. In some embodiments, the processing system 106 and the monitor 108 are separate components. In other embodiments, the processing system 106 and the monitor 108 are integrated in a single component. For example, the system 100 can include a touch screen device, including a housing having a touch screen display and a processor. The system 100 can include any suitable input device, such as a touch sensitive pad or touch screen display, keyboard/mouse, joystick, button, etc., for a user to select options shown on the monitor 108. The processing system 106, the monitor 108, the input device, and/or combinations thereof can be referenced as a controller of the system 100. The controller can be in communication with the device 102, the PIM 104, the processing system 106, the monitor 108, the input device, and/or other components of the system 100.

In some embodiments, the intraluminal device 102 includes some features similar to traditional solid-state IVUS catheters, such as the EagleEye® catheter available from Volcano Corporation and those disclosed in U.S. Pat. No. 7,846,101 hereby incorporated by reference in its entirety. For example, the intraluminal device 102 may include the scanner assembly 110 near a distal end of the intraluminal device 102 and a transmission line bundle 112 extending along the longitudinal body of the intraluminal device 102. The cable or transmission line bundle 112 can include a plurality of conductors, including one, two, three, four, five, six, seven, or more conductors.

The transmission line bundle 112 terminates in a PIM connector 114 at a proximal end of the intraluminal device 102. The PIM connector 114 electrically couples the transmission line bundle 112 to the PIM 104 and physically couples the intraluminal device 102 to the PIM 104. In an embodiment, the intraluminal device 102 further includes a guidewire exit port 116. Accordingly, in some instances the intraluminal device 102 is a rapid-exchange catheter. The guidewire exit port 116 allows a guidewire 118 to be inserted towards the distal end in order to direct the intraluminal device 102 through the lumen 120.

The monitor 108 may be a display device such as a computer monitor or other type of screen. The monitor 108 may be used to display selectable prompts, instructions, and visualizations of imaging data to a user. In some embodiments, the monitor 108 may be used to provide a procedure-specific workflow to a user to complete an intraluminal imaging procedure. This workflow may include performing a pre-stent plan to determine the state of a lumen and potential for a stent, as well as a post-stent inspection to determine the status of a stent that has been positioned in a lumen.

The processing system 106 can be in communication with an external imaging device (e.g., MRI, CT, x-ray such as angiography and/or fluoroscopy), and a displayed external or extraluminal view can be an external image itself or a 2D/3D reconstruction of the body lumen based on the external image, and in some embodiments the external or extraluminal view may include an indicator identifying a location of the intraluminal ultrasound image along a length of the body lumen in the external or extraluminal view.

Figure 2:
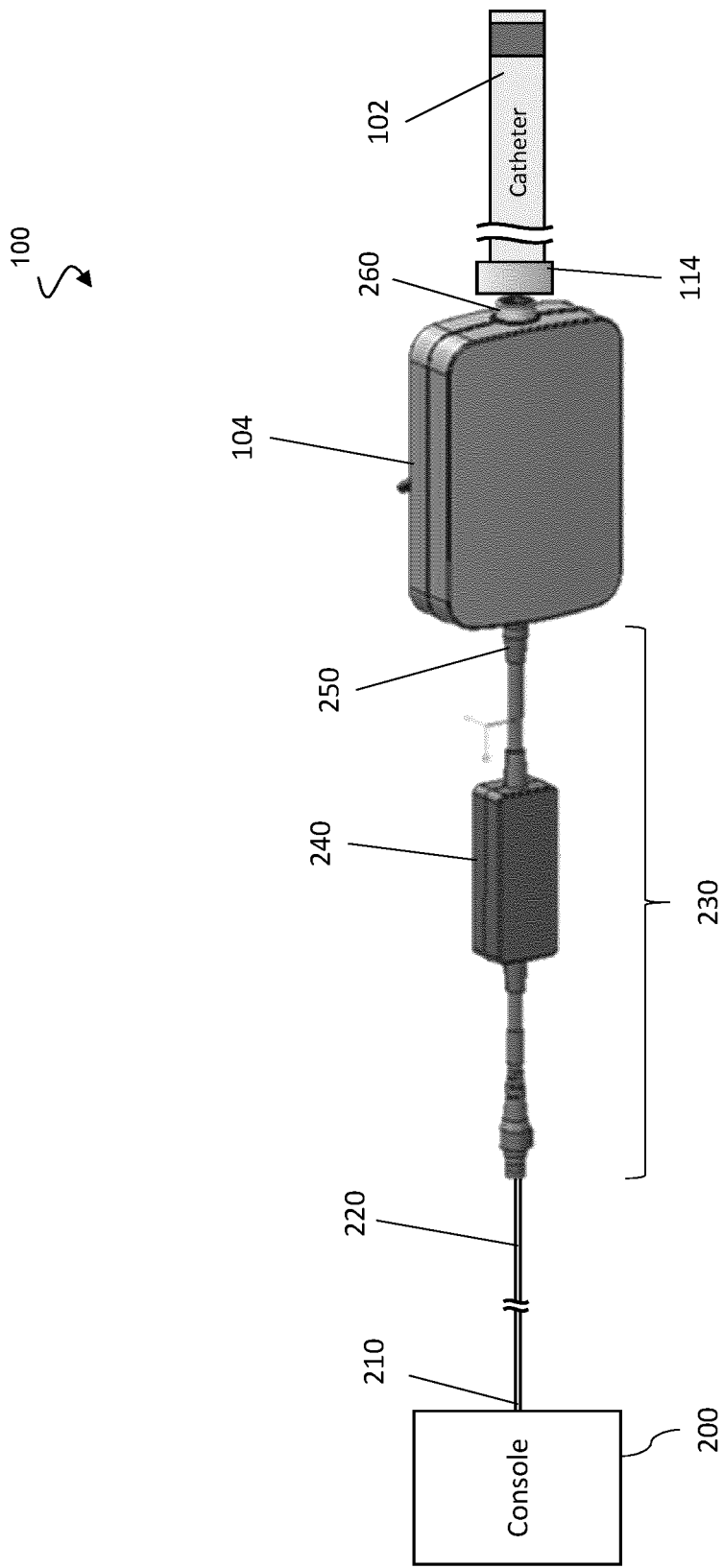
FIG. 2 is perspective view of a patient interface module (PIM) within an imaging system, in accordance with at least one embodiment of the present disclosure.

FIG. 2 is an exemplary arrangement of a PIM 104 within an imaging system 100, in accordance with at least one embodiment of the present disclosure. Visible is a console 200, which may include elements from FIG. 1 such as the processing system 106 and monitor 108. A connection 210 connects the console to a power and signal cable 220 that connects to, or is part of, a pigtail assembly or isolation connector assembly 230, which includes an isolation module 240 and a PIM connector 250 which connects to the PIM 104. The PIM 104 includes a PIM-to-catheter connector 260, which connects to the catheter-to-PIM connector 114, which is part of the catheter or intraluminal device 102.

In some embodiments, the thermal management system may be applied to other types of devices than PIMs, including but not limited to pigtail housings, ultrasound probe housings, ultrasound consoles, and trans-esophageal echocardiogram (TEE) probes. In some embodiments, the PIM is sized and shaped to be handheld. In other instances (e.g., during an imaging procedure), the PIM may be placed on a patient bed, hung from a bed rail, placed in a holder, placed on a cart, or otherwise positioned proximate to a patient.

Figure 3B:
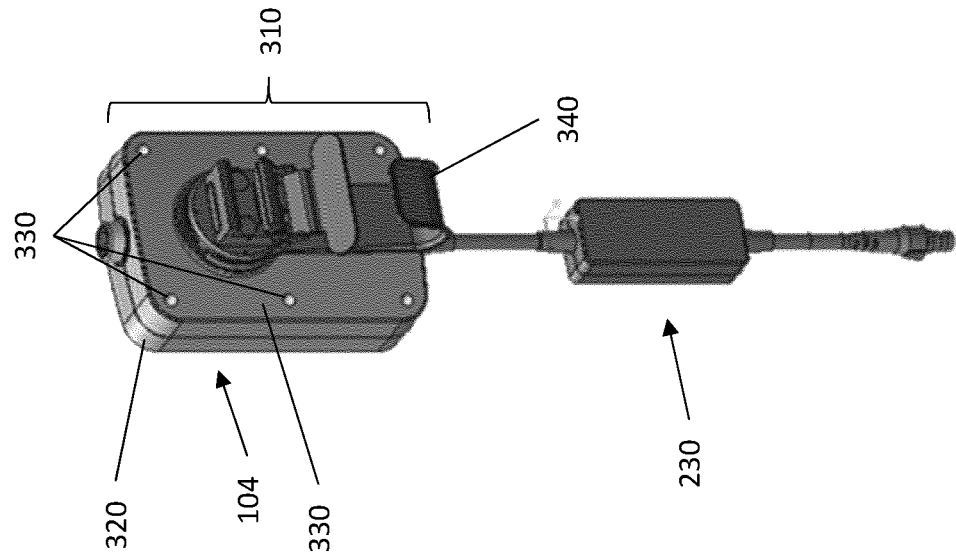
FIG. 3B is a bottom perspective view of an example PIM and pigtail, in accordance with at least one embodiment of the present disclosure.
Figure 3A:
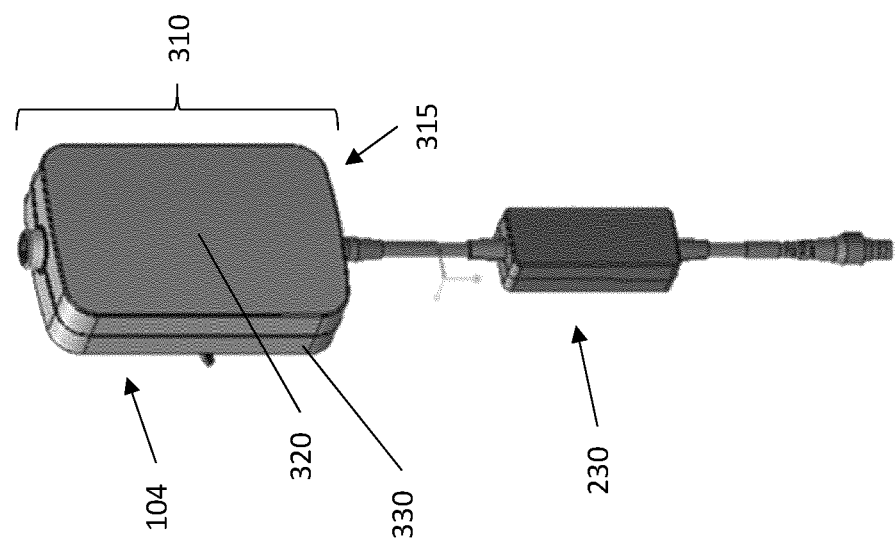
FIG. 3A is a top perspective view of an example PIM and pigtail, in accordance with at least one embodiment of the present disclosure.

FIG. 3A is a top perspective view of an example PIM 104 and pigtail 230, in accordance with at least one embodiment of the present disclosure. The PIM 104 comprises a case 310 that includes a top cover 320 and a bottom cover 330 that together define an interior volume (detailed below) and an exterior surface 315.

FIG. 3B is a bottom perspective view of an example PIM 104 and pigtail 230, in accordance with at least one embodiment of the present disclosure. The PIM 104 comprises a case 310 that includes a top cover 320 and a bottom cover 330. The bottom cover includes a plurality of through holes 330, and has an interface assembly 340 attached. The interface assembly 340 can, for example, be used to hang the PIM from a patient bed rail or other similar fixture.

In some embodiments, the whole enclosure surface 310 is made into an active heat transfer surface by embedding heat spreaders inside the plastic enclosure, case, or housing 310, as shown below. In some embodiments, the enclosure may be formed of a polymeric material having high thermal conductivity. The heat spreaders are in contact with all of, or a majority of, the inner surface of the plastic case or enclosure 310.

Figure 4:
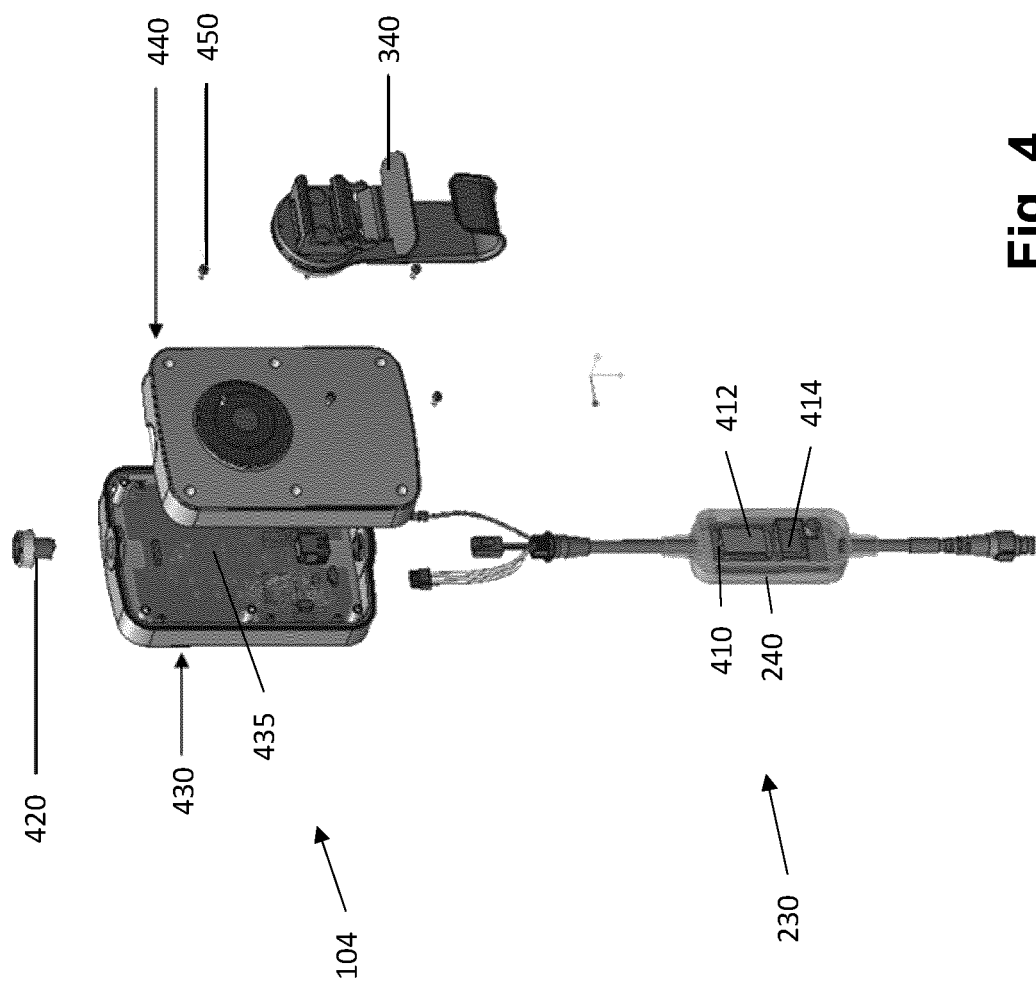
FIG. 4 is a bottom perspective exploded view of an example and pigtail, in accordance with at least one embodiment of the present disclosure.

FIG. 4 is a bottom perspective exploded view of an example PIM 104 and pigtail 230, in accordance with at least one embodiment of the present disclosure. The pigtail 230 includes an isolation module 240 that comprises a first printed circuit board (PCB) 410, including an electrically isolated 12V to 5V DC-DC converter 412 and an ethernet isolator 414. In an example, the isolation module prevents voltage spikes, current surges, or other electrical anomalies from passing between the PIM 104 and the console (e.g., console 210 of FIG. 2). The PIM 104 comprises a catheter connector assembly 420, a top cover assembly 430 comprising a second PCB 435, a bottom cover assembly 440, a plurality of mounting screws 450, and an interface assembly 340. The PCB 435 and its connectors are assembled to the top cover assembly 430 for ease of service and tolerance control between the PCB 435 and a heat spreader in the top cover assembly 430 as shown below.

FIGS. 5-12 illustrate aspects of the PIM heat management system as applied to the PIM device described in FIGS. 1-4.

Figure 5:
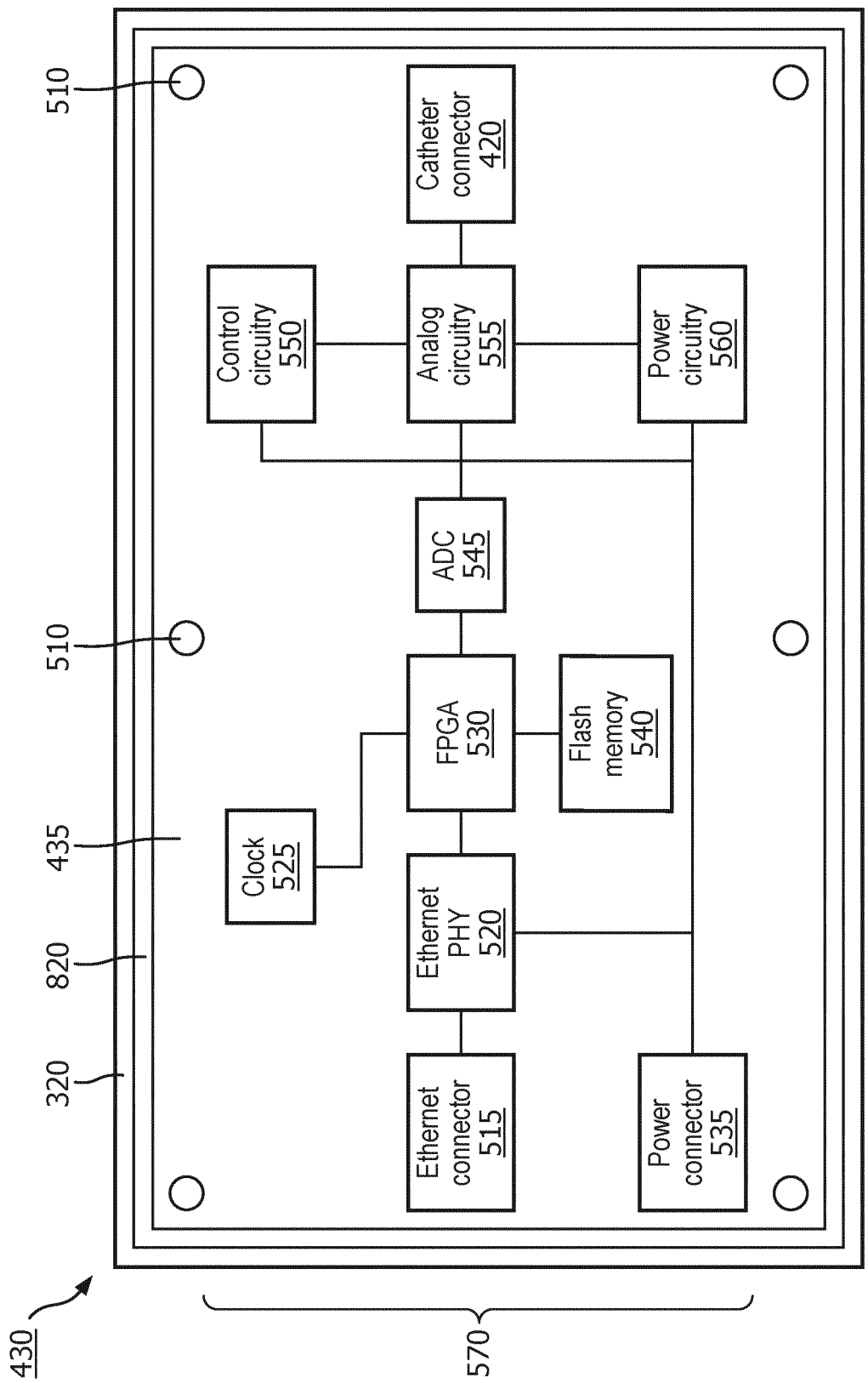
FIG. 5 is a diagrammatic schematic view of an example top cover assembly, in accordance with at least one embodiment of the present disclosure.

FIG. 5 is a diagrammatic representation of an example top cover assembly 430, in accordance with at least one embodiment of the present disclosure. The top cover assembly 430 includes a top cover 320, top cover heat spreader 820, PCB 435, and a plurality of through-holes or threaded screw holes 510. The diagram illustrates that the heat spreader 820 is positioned between the PCB 435 and the top cover 320, such that, for example, the heat spreader 820 may fit inside the recessed shape of the top cover 320, and the PCB 435 may fit inside a similar recessed shape of the heat spreader 820. In other embodiments, the heat spreader 820 may be a plate or surface that is positioned to provide some surface area contact with both the PCB 435 and the top cover 320.

The PCB 435 comprises electronic circuitry 570 that comprises a plurality of electronic components, including a network connector 515, network controller 520, clock 525, processor 530, power connector 535, flash memory 540, analog-to-digital converter (ADC) 545, control circuitry 550, analog circuitry 555, power circuitry 560, and a catheter connector 420. Depending on the implementation, other components may be present on the PCB 435 instead of or in addition to those listed here, and some components listed may not be present. In an example, the network connector 515 may be an RJ45 ethernet connector conforming to the IEEE 802.3 standard, or may be a USB or HDMI connector, a proprietary communication link, or other type of connector or communication link capable of connecting the PIM 104 to the console 200. In an example, the network controller 520 may be an ethernet PHY, the processor 530 may be a field-programmable gate array (FPGA), application-specific integrated circuit (ASIC), or other integrated circuit (IC), the power connector 535 may be a 5V power connector, and the power circuitry 560 may include for example a power management integrated circuit (PMIC) to step down voltages and distribute power to other parts of the PCB, although in other examples, other components may be employed instead of or in addition to those listed.

Each electronic component of the circuitry 570 generates a certain amount of heat during operation. However, some electronic components 570 typically generate more heat than others, and in a typical printed circuit board there are a small number of components that are collectively responsible for the majority of generated heat. In an example, a majority of heat generated by the PCB 435 comes from the power circuitry 560, the processor 530, and the network controller 520, and thus management of the heat generated by the PCB 435 requires particular attention to these components, whereas the heat generated by other components of the circuitry 570 may be small enough that it does not need to be mitigated with specific design features, other than those that apply to the PCB in general. In other embodiments, other components may be responsible for the majority of generated heat.

Figure 6:
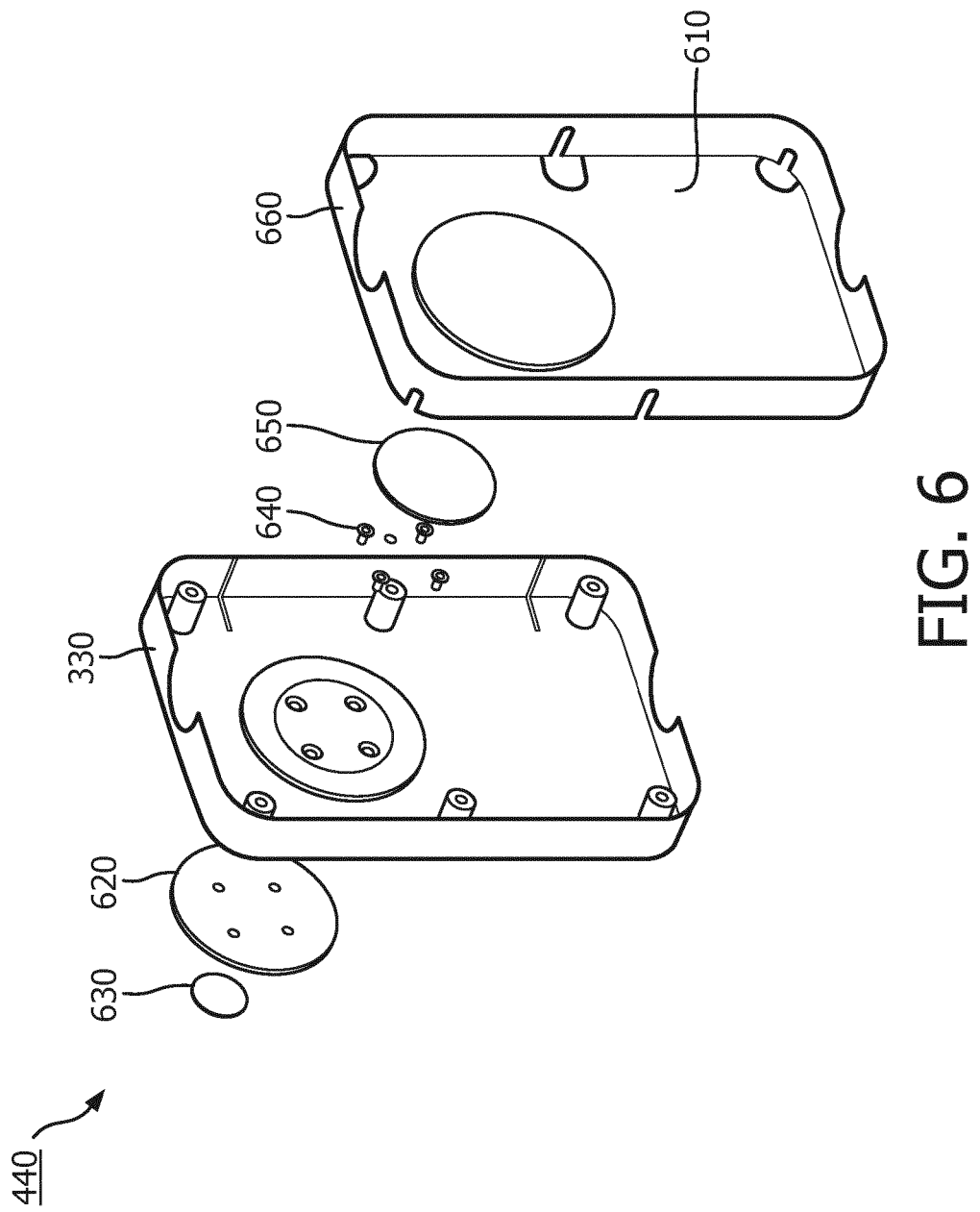
FIG. 6 is a perspective exploded view of an example bottom cover assembly, in accordance with at least one embodiment of the present disclosure.

FIG. 6 is a perspective exploded view of an example bottom cover assembly 440, in accordance with at least one embodiment of the present disclosure. The bottom cover assembly 440 includes the bottom cover 330, a bottom cover heat spreader 610, interface locking pin 620, interface locking pin cover 630, a plurality of interface locking pin mounting screws, and an insulating sheet or screw cover 650. The locking pin 620 facilitates coupling of the interface assembly 340 to the bottom cover 330 as shown for example in FIG. 4. The bottom cover heat spreader 610 is made from a thermally conductive material that distributes heat, such that hot spots generated within the PIM (e.g., by components 570 on the PCB 435 as shown in FIG. 5) are less likely to create corresponding hot spots on the outside of the bottom cover 330. The bottom cover heat spreader 610 includes a lip 660. In an example, the lip 660 has a surface flatness tolerance of 0.1 mm to ensure proper fit with the top cover heat spreader 820 (as shown for example in FIG. 8).

In an example, the bottom cover 330 is made of ABS VO polymer rated per UL 94, with a smooth finish and no exterior paint or coatings, although other materials could be used instead or in addition. In an example, the bottom cover heat spreader 610 is made of 6061-T6 aluminum with a clear, hard, anodized finish, although other thermally conductive materials could be used instead or in addition. In other embodiments, the heat spreader may be made from high-conductivity materials including but not limited to aluminum, copper, or magnesium, graphite or graphene sheets, or may be a heat pipe or vapor chamber as described below. In that regard, in some embodiments, the heat spreader 610 comprises a material with a higher thermal conductivity than the bottom cover 330.

Figure 7:
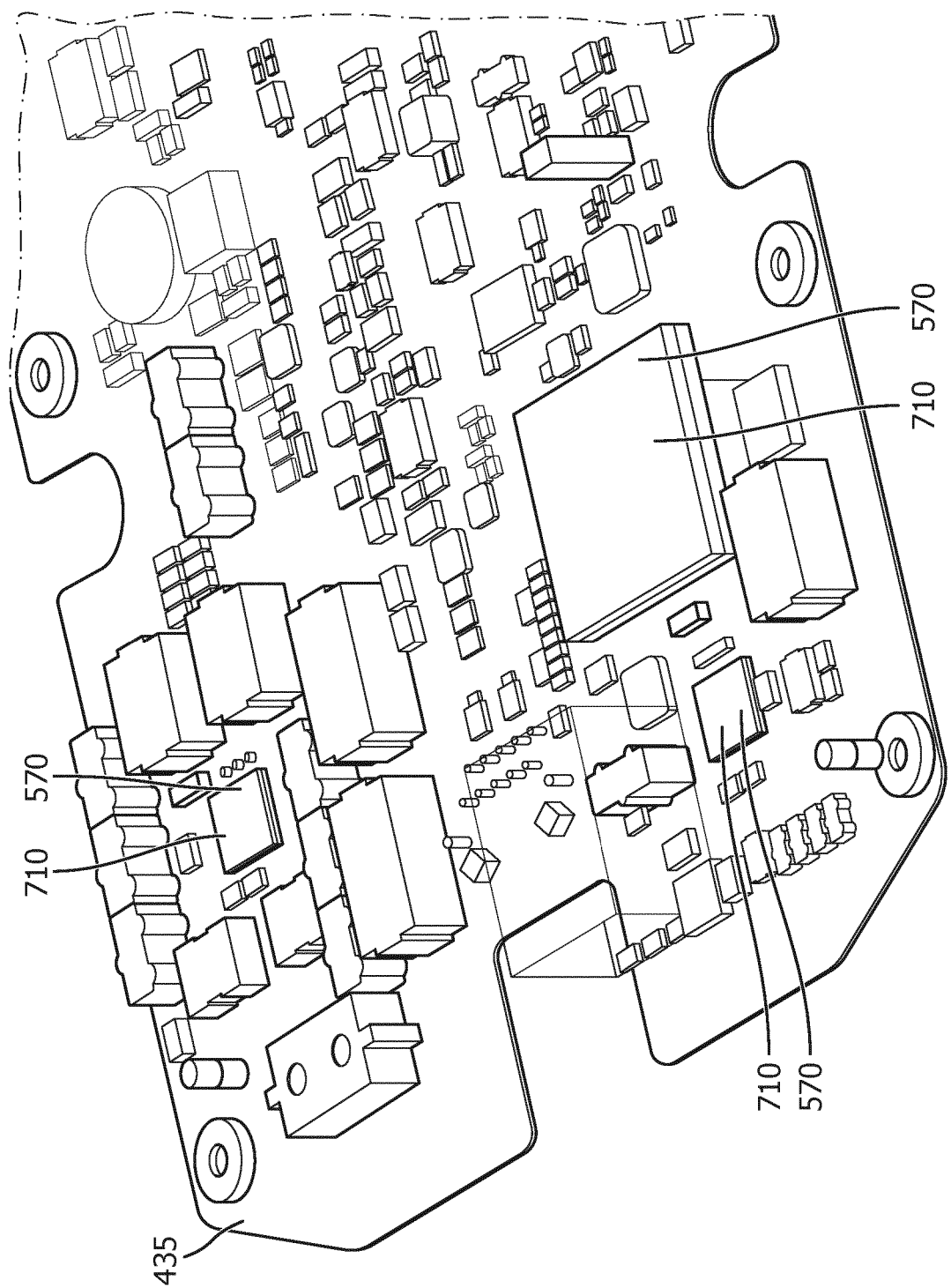
FIG. 7 is a perspective view of a portion of a printed circuit board, in accordance with at least one embodiment of the present disclosure.

FIG. 7 is a partial perspective view of an example PCB 435 in accordance with at least one embodiment of the present disclosure. In this example, the PCB 435 includes three primary heat-generating electronic components 570. In order to facilitate conductive heat transfer out of these electronic components 570, the components 570 have been covered with thermal gap pads 710. In some embodiments, the thermal gap pads are patches of a thermal gap filler material, each sized to largely cover or completely cover the top surface of the case (e.g., an integrated circuit case) of the electronic component 570 upon which they are positioned, without significantly projecting past the edges of the electronic component 570. In some embodiments, the thermal gap pad material has a relatively high thermal conductivity (e.g., 2-5 W/mK) as compared with other gap pad materials with lower thermal conductivity (e.g., 0.1-1.0 W/mK). Further, in some embodiments, the thermal gap pad material is compliant, and wets out readily onto smooth surfaces (e.g., excludes air between the surface of the thermal gap pad and another surface, such as the surface of an integrated circuit case) such that it may adhere naturally, without the need for a thermal paste or adhesive. In other embodiments, a thermal paste or adhesive may be employed to couple the thermal gap pads 710 to certain electronic components 570. The compliance of the thermal gap pad material may facilitate forming a conductive heat path between an electronic component 570 and another solid object, such as the bottom cover heat spreader 610 of FIG. 6, or the top cover heat spreader 820 of FIG. 8. Ordinarily, small irregularities in the surfaces of solid objects mean that when they are pressed together, only a small portion of their surface areas are in contact. The compliance of the thermal gap pad may substantially increase the contact area between the two surfaces, and thus improve the conduction of heat. In an example, the thermal gap pad material is Berquest GAP PAD HC 3.0, with a thermal conductivity of 3 W/mK and a thickness of 1.5 mm. However, a wide variety of other gap fillers may be employed, including but not limited to TG-A3500 from T-global Technology or Tflex™ 5000 thermal gap fillers from Laird corporation, as well as thermally conductive pastes or liquids such as Bergquist gap filler materials from Henkel. Other materials are also contemplated.

In some cases, a majority of the heat generated by an electronic component, such as an integrated circuit chip, travels from the core of the chip to the top of the chip casing, because of low thermal resistance between the core and casing of the chip, while a minority of the heat passes into the PCB, because of higher thermal resistance from core to base. Therefore, conducting heat out of the top of a component casing may be an effective way to cool the component.

Figure 8:
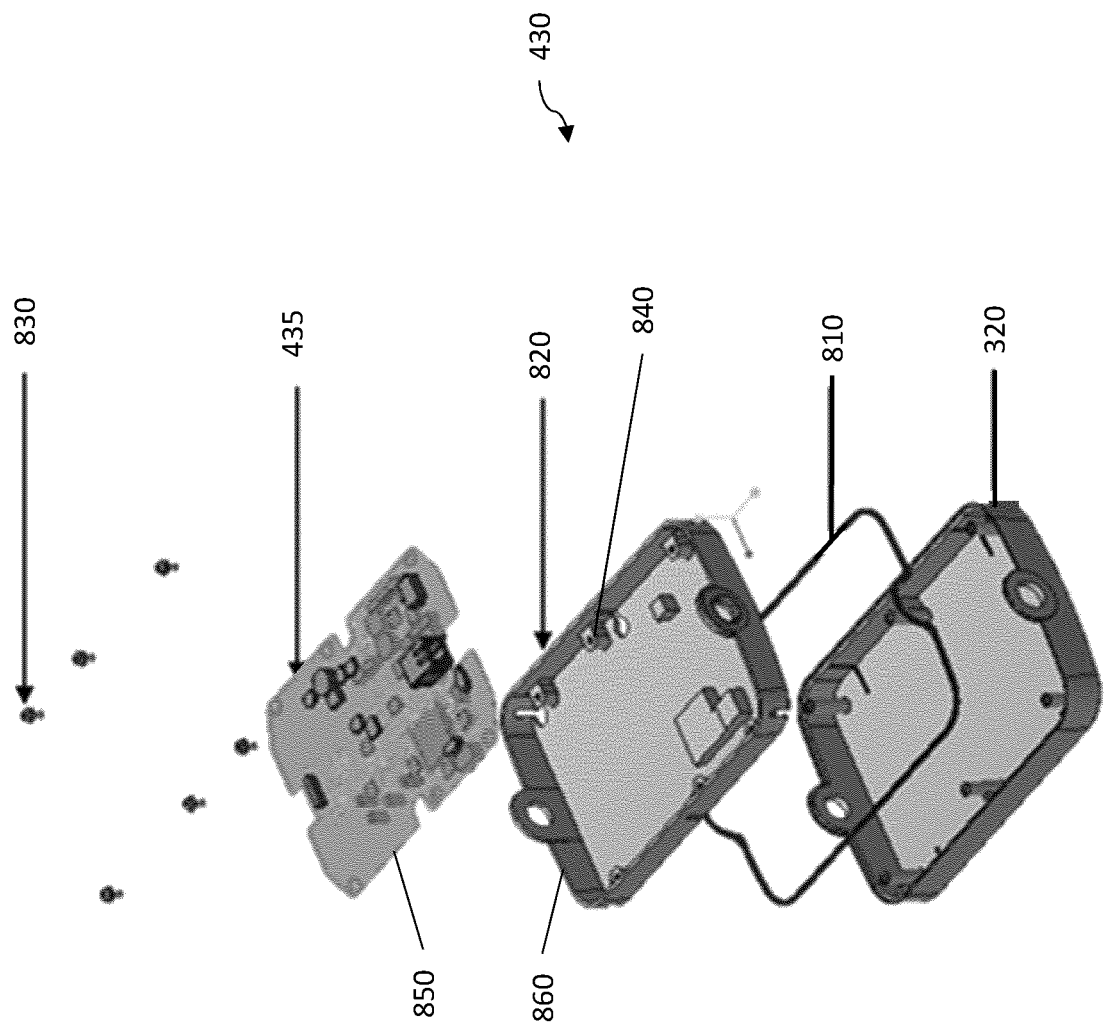
FIG. 8 is a bottom perspective, exploded view of an example top cover assembly, in accordance with at least one embodiment of the present disclosure.

FIG. 8 is a bottom perspective, exploded view of an example top cover assembly 430, in accordance with at least one embodiment of the present disclosure. In the example shown in FIG. 8, the top cover assembly includes a top cover 320, gasket 810, top cover heat spreader 820, PCB 435, and a plurality of PCB mounting screws 830 that attach the PCB 435 to threaded screw holes 840 in the top cover heat spreader 820. The top cover heat spreader 610 is made from a thermally conductive material that distributes heat, such that heat from hot spots generated within the PIM (e.g., by heat-generating components 570 on the PCB 435 as shown in FIG. 7) is widely distributed, and is less likely to create corresponding hot spots on the outside of the top cover 320. In some embodiments, the mounting screws 830 connect through a heat-conducting layer 850 within the PCB, such as for example a ground plane layer or heat plane layer, such that heat generated within the PCB is distributed through the heat conducting layer 850, and is then conducted into the top cover heat spreader 820 at least in part through the mounting screws 830. The gasket 810 helps seal the top cover 320 and bottom cover 330 of the device together and protect against fluid ingress.

In an example, the top cover heat spreader 820 is made of 6061-T6 aluminum with a clear, hard, anodized finish, although other thermally conductive materials could be used instead or in addition, including but not limited to copper, magnesium, graphite, or carbon fiber. In an example, the top cover 320 is made of a thermoplastic material, such as polycarbonate, ABS, polyamide, polystyrene, or combinations thereof. In one example, the top cover 320 comprises ABS VO polymer rated per UL 94, with a smooth finish and no exterior paint or coatings, although other materials could be used instead or in addition. In an example, the gasket 810 is made of Elastosil R 401/50, although other materials could be used instead or in addition, and other sealing methods may be used, including O-rings, custom gaskets, liquid caskets, glue bonding, ultrasonic welding, etc.

Figure 9:
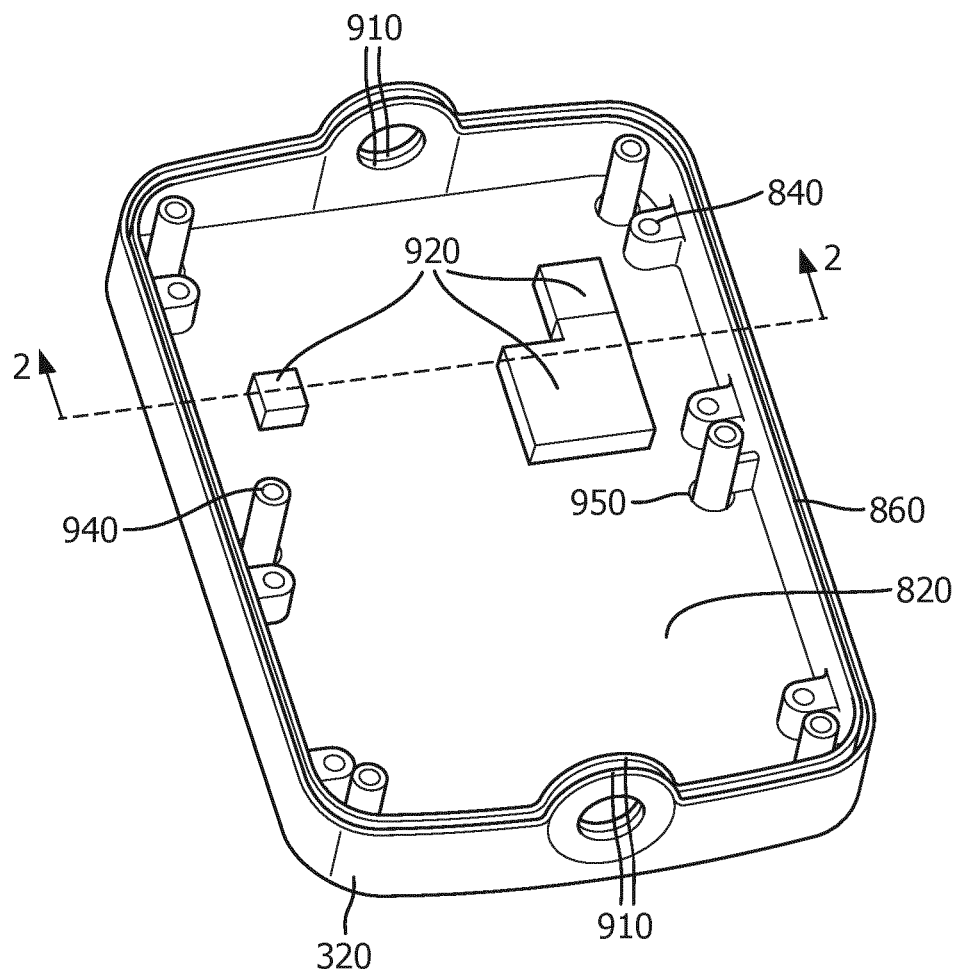
FIG. 9 is a bottom perspective view of an example top cover heat spreader fitted into an example top cover, in accordance with at least one embodiment of the present disclosure.

FIG. 9 is a bottom perspective view of an example top cover heat spreader 820 fitted into an example top cover 320, in accordance with at least one embodiment of the present disclosure. The top cover 320 and top cover heat spreader 820 each include two connector through holes 910 through which the catheter connector 260 (as shown for example in FIG. 2) and network connector 515 and power connector 535 (as shown for example in FIG. 5) can be connected. The top cover heat spreader 820 also includes a plurality of threaded screw holes 840, through which the PCB 435 (as shown for example in FIG. 8) can be coupled to the top cover head spreader 820. In addition, the top cover heat spreader includes a plurality of through holes 950, through which a plurality of threaded top cover connection posts 940 project. The top cover connection posts 940 permit the top cover 320 to be coupled to the bottom cover 440 with a plurality of screws or other fasteners 450 (as shown for example in FIG. 4).

In the example shown in FIG. 9, the top cover heat spreader 820 also includes a number of raised, thermally conductive protrusions or towers 920. In some embodiments, these protrusions or towers 920 are sized, shaped, and positioned such that when the PCB 435 is coupled to the top cover heat spreader 820, the towers contact the thermal gap pads 710 that cover the heat-generating components 570 on the PCB 435 (as shown for example in FIG. 7). In some embodiments, the towers or protrusions 920 are several tiles taller than the thermal gap pads, and are sized, shaped, and positioned such that the thermal gap pads 710 are partially compressed, and a thermally conductive contact surface is formed between the conductive protrusions or towers 920 and the thermal gap pads 710. This allows heat generated by the components 570 to conduct upward through the thermal gap pads 710, through the conductive protrusions or towers 920, and into the top cover heat spreader 820, where the conductivity of the top cover heat spreader 820 will tend to spread the heat, such that hot spots are less likely to form on the outer surface of the top cover 320.

The top cover heat spreader 820 includes a lip 860. In an example, the lip 860 has a surface flatness tolerance of 0.1 mm to ensure proper mating or fit with the bottom cover heat spreader lip 660 (as shown for example in FIG. 6). This mating or fit forms a thermal interface between the two heat spreaders that permits heat to be conducted between the top cover heat spreader 820 and bottom cover heat spreader 610, which helps distribute heat more evenly within the PIM (element 104 in FIG. 2) and prevent hot spots on the PIM case (element 310 in FIGS. 3A and 3B). In some embodiments, the top cover heat spreader lip 860 may include a groove to accept, and maximize contact area with, the bottom cover heat spreader lip 660. In other embodiments, the bottom cover heat spreader lip 660 may include a similar groove instead or in addition.

Other arrangements of components are possible and may be used instead of or in addition to the arrangement shown in FIG. 9. Section line 2-2 marks a cutaway view plane that will be used for FIG. 10.

Figure 10:
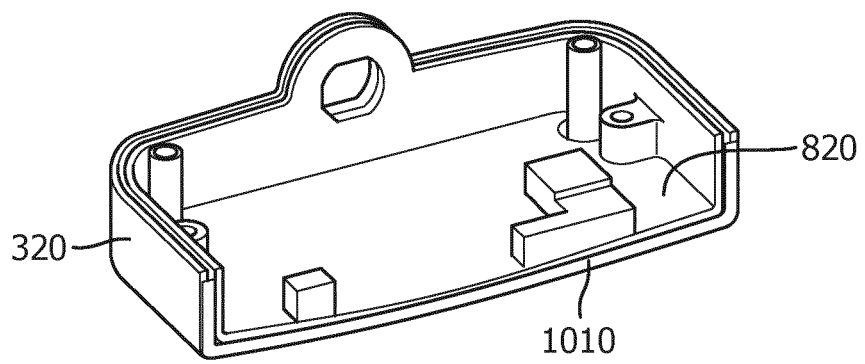
FIG. 10 is a bottom perspective cutaway view of an example top cover heat spreader fitted into an example top cover, in accordance with at least one embodiment of the present disclosure.

FIG. 10 is a bottom perspective cross-sectional view of an example top cover heat spreader 820 fitted into an example top cover 320, in accordance with at least one embodiment of the present disclosure. Specifically, FIG. 10 is a cross-sectional view of the structure shown in FIG. 9, that has been cut along a plane parallel to section line 2-2. Visible are the top cover 320 and top cover heat spreader 820, along with a layer of adhesive 1010. In an example, the adhesive 1010 is a thermally conductive adhesive, and a similar thermal adhesive layer exists between the bottom cover and bottom cover heat spreader (elements 330 and 610 in FIG. 6). To provide effective heat transfer, it is desirable for the thermally conductive adhesive 1010 to be applied to the entire contact area between the top cover head spreader 820 and the top cover 320. In an example, the thermally conductive adhesive is Henkel Liqui-Bond EA 1805, although other adhesives may be used instead or in addition, including but not limited to Master bond EP30TC, EP3HTS-LO, Ele-colit® 6603, or any of a wide variety of other adhesives. A thin, die-cut gap filler material (as described above) can also be used for this purpose.

Figure 11:
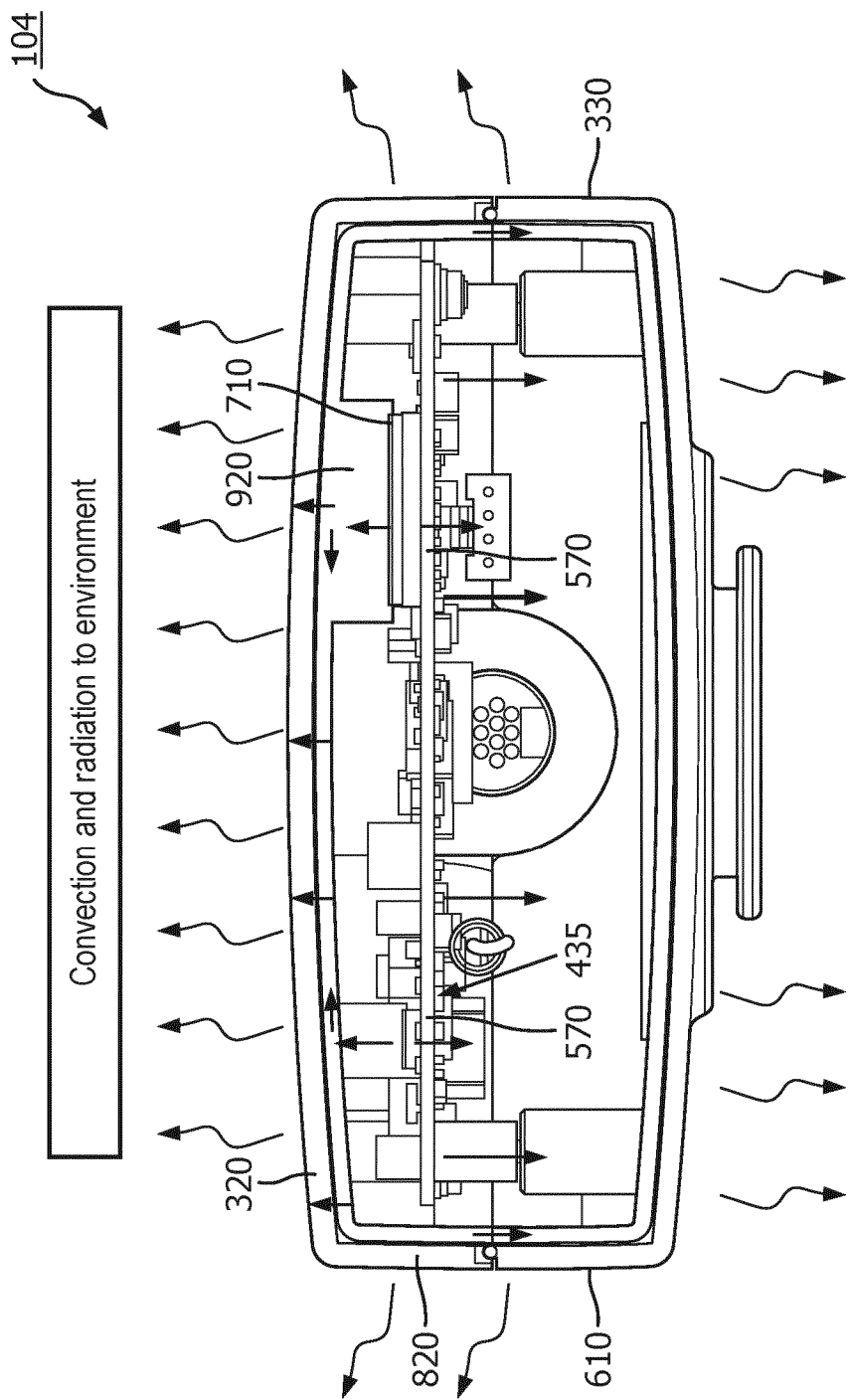
FIG. 11 is a side cutaway view of an assembled PIM, in accordance with at least one embodiment of the present disclosure.

FIG. 11 is a side cross-sectional view of an assembled PIM 104, in accordance with at least one embodiment of the present disclosure. Visible are the top cover 320, top cover heat spreader 820, PCB 435, bottom cover heat spreader 610, and bottom cover 330. When heat is generated by heat-generating components 570 on the PCB 435, a portion of the heat radiates and conducts downward into the bottom cover heat spreader 610, and a portion conducts upward through the thermal gap pads 710 and conductive protrusions or towers 920, and into the top cover heat spreader 820. Because the top cover heat spreader 820 is in conductive thermal contact with the bottom cover heat spreader 610 through at least the top cover heat spreader lip and bottom cover heat spreader lip (element 860 of FIG. 8 and element 660 of FIG. 6, respectively), heat will tend to conduct from whichever heat spreader is hotter to whichever heat spreader is cooler, thus distributing heat more evenly within the PIM 104 and reducing the occurrence of hot spots in the top cover 320 and bottom cover 330. Heat then conducts from the top cover heat spreader 820 into the top cover 320, and from the bottom cover heat spreader 610 into the bottom cover 330. This causes the top cover 320 and bottom cover 330 to heat up, and to shed heat into the ambient environment through a combination of conduction, convection, and radiation. High emissivity of the plastic outer surface of the top cover 320 and bottom cover 330 provides for efficient radiative heat transfer. In an example, the top cover 320 and bottom cover 330 have substantially higher emissivity than the top cover heat spreader 820 and bottom cover heat spreader 620.

Embodiments of the present disclosure reduce hot spots in the top cover 320 and bottom cover 330, and reduce the average or overall surface temperature of the enclosure during normal operation of the PIM 104. To facilitate heat transfer, the PCB 435 is directly mounted to the top cover heat spreader, and the high-heat components of the PCB 435 are thermally coupled to the cop cover heat spreader through thermally conducting gap pads 570. The O-ring or gasket (element 810 of FIG. 8) provided between the top cover and bottom cover of the PIM compresses and seals the enclosure to provide ingress protection from fluids. The two heat spreaders meet at the enclosure parting surface and are held in compression as the screws are fastened to join together the top cover and bottom cover assemblies. This creates a thermal junction or thermal contact area between the top cover heat spreader 820 and the bottom cover heat spreader 610, that allows heat to flow from the hotter heat spreader to the cooler one (e.g., from the top cover heat spreader to the bottom cover heat spreader), thus helping to distribute heat more evenly and thus shed it more effectively.

Thus, in the example shown in FIG. 11, the PCB 435 is mechanically coupled to the top cover heat spreader 820, while the heat-generating components 570 of the PCB 435 are in thermal contact with the top cover heat spreader 820. The top cover heat spreader 820 is also in thermal contact with the top cover 320, and with the bottom cover heat spreader 610, which is in thermal contact with the bottom cover 330. The top cover 320 is mechanically coupled to the top cover heat spreader 820, to the bottom cover 330, and to the bottom cover heat spreader 610. Thermal contact may be by direct contact, or indirect contact via thermally conductive pads, pastes, adhesives, or other materials. Mechanical coupling may be by screws, bolts, pins, clamps, welds, adhesives, or other components/materials.

Figure 12:
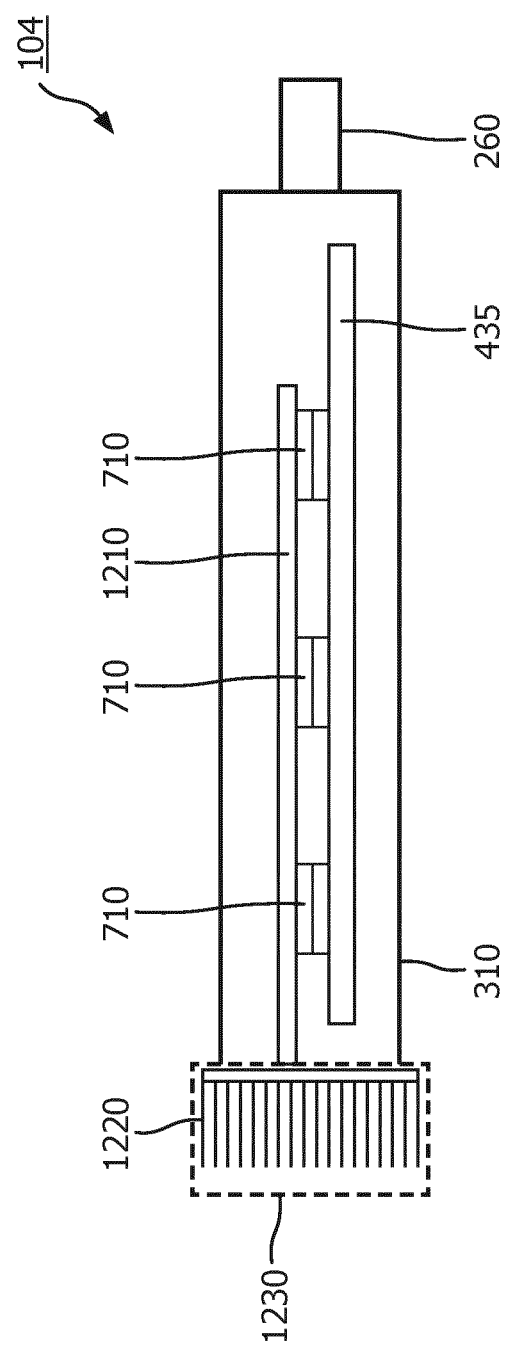
FIG. 12 is a diagrammatic cutaway view of an example in accordance with at least one embodiment of the present disclosure.

FIG. 12 is a diagrammatic cutaway view of an example PIM 104 in accordance with at least one embodiment of the present disclosure. Visible are the sealed PIM case 310, PIM-to-catheter connector 260, and PCB 435. In the example shown in FIG. 12, heat is transferred away from the PCB 435 by a heat pipe, vapor chamber, or heat spreader 1210 in contact with thermal gap pads 710. A heat pipe is a tube whose central lumen is divided by a longitudinal divider and fully or partially filled with a working fluid which circulates through the divided lumen, carrying heat from a hotter end of the tube to a cooler end of the tube in a one-dimensional flow. In some examples, the working fluid fills approximately 30% of the internal volume of the heat pipe, and the working fluid evaporates at the hot end of the tube and re-condenses at the cold end. Heat pipes tend to have substantially lower thermal resistance (or higher thermal conductivity) than solid materials (e.g., copper) of similar dimensions. A vapor chamber is similar to a heat pipe, but permits the working fluid to flow in two dimensions, rather than one dimension as with a heat pipe. In the example shown in FIG. 11, the heat pipe, vapor chamber, or heat spreader 1210 carries heat from the PCB 435 through the thermal gap pads 710 and transports it to a heat sink 1220 located in a separate, unsealed heat sink enclosure 1230 that may provide significant air flow for convective cooling of the heat sink 1220, while preventing a patient, clinician, or other user from coming in direct contact with the heat sink 1220. In an example, the heat sink is a high-surface-area device, whose surface area may exceed the surface area of the PIM enclosure. Depending on the implementation, the heat sink 1220 may be a passive heat sink or may include a fan, radiator, or other active cooling mechanism. In some embodiments, the heat pipe 1210 and heat sink 1220 can be coupled to the enclosure 310 and/or to the enclosure 1230.

The passive heat sink 1220 and heat spreader 1210 are coupled through a highly thermal conducting interface, with sufficient clamping force to reduce contact resistance. This can be accomplished for example by a spring-loaded interface or by use of high strength magnets. The passive heat sink 1220 with protected grill 1230 is configured to be removed for cleaning and disinfecting purposes. It is noted also that a while most of the heat is dissipated through the heat sink 1220 owing to the lower resistance path, a smaller amount of heat also is dissipated from the enclosure 310 surface via radiation and convection. Because the passive heat sink 1220 is protected by a grill 1230 or unsealed enclosure, it is able to run at high temperature, as it is not in direct contact with user, and the plastic enclosure surface can be maintained at the temperature prescribed in the regulatory standard.

In the medical devices industry, there is a growing need for miniaturization, coupled with growing electronic power, which means more heat in smaller spaces. This makes it more difficult to ensure that medical devices operate within appropriate operating temperature ranges as required by regulation. Proper thermal management can extend the useful life of these components exponentially, hence this technology can be applied to any compact, high-performance device in medical and consumer lifestyle products. Newer PIMs require high speed digital data processing in a smaller footprint, and must be sealed for ingress protection to meet sterility requirements. These devices are used in a catheter lab where all the devices are draped during a IVUS imaging procedure. This becomes extremely challenging to meet thermal requirements. Tests have shown that the disclosed concepts work even in unfavorable use case scenarios such as the PIM being placed under the foam mattress of a patient bed.

Accordingly, it can be seen that the PIM thermal management system embodiments described herein advantageously provide passive thermal management to compact, high-power devices, permitting them to run at surface temperatures well below regulated limits. A number of variations are possible on the examples and embodiments described above. For example, different numbers or arrangements of thermal gap pads, heat spreaders, heat pipes, or vapor chambers may be used. The system can be made from a variety of different materials, and can be held together by various means including screws, bolts, pins, clamps, bands, shrink wrap tubing, or other means known in the art. The size and shape of the PIM or its components may be different than shown herein. The technology described herein may be employed in other kinds of devices, including mobile phones, tablet computers, laptops, and virtual reality or augmented reality headsets.

The logical operations making up the embodiments of the technology described herein are referred to variously as operations, steps, objects, elements, components, or modules. Furthermore, it should be understood that these may occur or be performed or arranged in any order, unless explicitly claimed otherwise or a specific order is inherently necessitated by the claim language. All directional references e.g., upper, lower, inner, outer, upward, downward, left, right, lateral, front, back, top, bottom, above, below, vertical, horizontal, clockwise, counterclockwise, proximal, and distal are only used for identification purposes to aid the reader's understanding of the claimed subject matter, and do not create limitations, particularly as to the position, orientation, or use of the PIM thermal management system. Connection references, e.g., attached, coupled, connected, and joined are to be construed broadly and may include intermediate members between a collection of elements and relative movement between elements unless otherwise indicated. As such, connection references do not necessarily imply that two elements are directly connected and in fixed relation to each other. The term "or" shall be interpreted to mean "and/or" rather than "exclusive or." Unless otherwise noted in the claims, stated values shall be interpreted as illustrative only and shall not be taken to be limiting.

The above specification, examples and data provide a complete description of the structure and use of exemplary embodiments of the PIM thermal management system as defined in the claims. Although various embodiments of the claimed subject matter have been described above with a certain degree of particularity, or with reference to one or more individual embodiments, those skilled in the art could make numerous alterations to the disclosed embodiments without departing from the spirit or scope of the claimed subject matter. For example, a thermally conductive adhesive, paste, or gap pad could be employed between the top cover head spreader lip and the bottom cover heat spreader lip, to increase contact area and improve heat conduction between the two heat spreaders. Conductive protrusions could be fashioned into the bottom case heat spreader as well as the top case heat spreader. A thermally conductive ground plane layer or heat plane layer may be incorporated into the printed circuit board, and may be coupled to the heat spreaders or product case or housing by means of screws, pins, protrusions, heat pads, heat pipes, vapor chambers, or other means. High-emissivity coatings could be applied to the heat spreaders to improve their ability to absorb heat radiatively.

It is understood that embodiments of the present disclosure can include one, two, three, four, and/or any suitable number of heat spreaders. The heat spreaders can have similar or different sizes and shapes. Similarly, it is understood that that present disclosure can include one, two, three, four, and/or any suitable number of cover portions that form an enclosure. The cover portions can have similar or different sizes and shapes. Any suitable number of heat spreaders and/or cover portions can be coupled together to form the enclosure of the PIM housing.

Still other embodiments are contemplated. It is intended that all matter contained in the above description and shown in the accompanying drawings shall be interpreted as illustrative only of particular embodiments and not limiting. Changes in detail or structure may be made without departing from the basic elements of the subject matter as defined in the following claims.

What is claimed is:
1. A system, comprising:
a patient interface module (PIM) distinct from and positioned between:
   an intravascular imaging catheter configured to obtain intravascular image data while the intravascular imaging catheter is inside a blood vessel; and
   a console configured to generate an intravascular image based on the intravascular image data,
wherein the PIM is configured to provide communication for the intravascular image data from the intravascular imaging catheter to the console,
wherein the PIM comprises:
   a printed circuit board; and
   an enclosure,
wherein the printed circuit board is disposed within the enclosure,
wherein the enclosure is configured to disperse heat generated by the printed circuit board,
wherein the enclosure comprises:
   a first heat spreader coupled to and in thermal contact with the printed circuit board;
   a second heat spreader in thermal contact with the first heat spreader at an interface such that the heat is distributed between the first heat spreader and the second heat spreader across the interface;

a first cover portion coupled to and in thermal contact with the first heat spreader; and a second cover portion coupled to and in thermal contact with the second heat spreader, wherein the first cover portion is coupled to the second cover portion to form the enclosure.

2. The system of claim 1, wherein the first heat spreader is thermally coupled to the printed circuit board by at least one of conductive protrusions, conductive fasteners, or conductive thermal gap pads.

3. The system of claim 1, wherein at least one of the first heat spreader or the second heat spreader comprises a thermally conductive material.

4. The system of claim 1, wherein the first heat spreader comprises a heat pipe or a vapor chamber.

5. The system of claim 4, wherein the second heat spreader comprises a heat sink.

6. The system of claim 5, wherein the PIM further comprises a ventilated enclosure separably coupled to the enclosure, wherein the heat sink is enclosed within the ventilated enclosure.

7. The device system of claim 1, wherein at least one of the first cover portion or the second cover portion comprises a material with a higher emissivity and a lower thermal conductivity than the first and second heat spreaders.

8. The system of claim 1, wherein at least one heat spreader is coupled to at least one cover portion by a thermally conductive adhesive, and wherein a shape of the at least one heat spreader matches a shape of the at least one cover portion to maximize a thermal contact area.

9. The system of claim 1, wherein the PIM further comprises a gasket between the first cover portion and the second cover portion, wherein the first cover portion is coupled to the second cover portion by a plurality of fasteners.

10. The system of claim 9, wherein the enclosure is sealed to resist intrusion of moisture and dust.

11. The system of claim 1, wherein the printed circuit board comprises:

at least one connector; and a plurality of electronic components.

12. The system of claim 11, wherein the first heat spreader is coupled to the printed circuit board by thermal gap pads on at least some of the electronic components, wherein the thermal gap pads are in contact with conductive protrusions formed into a surface of the first heat spreader.

13. The system of claim 11, wherein the enclosure comprises openings for the at least one connector.

14. The system of claim 11, wherein the first heat spreader, the second heat spreader, the first cover portion, and the second cover portion are configured to maintain a surface temperature of the enclosure below a threshold value during operation of the printed circuit board.

15. The system of claim 1, wherein the first heat spreader is coupled to the second heat spreader by a lip and a groove.

16. The system of claim 1, further comprising the intravascular imaging catheter.

17. The system of claim 1, further comprising the console.

* * * * *